United States Patent [19]
Kuramata

[11] Patent Number: 5,850,410
[45] Date of Patent: Dec. 15, 1998

[54] SEMICONDUCTOR LASER AND METHOD FOR FABRICATING THE SAME

[75] Inventor: Akito Kuramata, Kawasaki, Japan

[73] Assignee: Fujitsu Limited, Kawasaki, Japan

[21] Appl. No.: 617,202

[22] Filed: Mar. 18, 1996

[30] Foreign Application Priority Data

Mar. 16, 1995 [JP] Japan ................................. 7-057060

[51] Int. Cl.⁶ .................................................. H01S 3/18
[52] U.S. Cl. ............................................. 372/43; 257/94
[58] Field of Search ................................. 372/43, 45, 46;
257/94, 95, 190, 352, 354, 353, 623, 628;
438/46

[56] References Cited

U.S. PATENT DOCUMENTS

| | | | |
|---|---|---|---|
| 4,987,472 | 1/1991 | Endo et al. | 357/60 |
| 5,608,749 | 3/1997 | Kizuki | 372/36 |
| 5,625,202 | 4/1997 | Chai | 257/94 |
| 5,701,321 | 12/1997 | Hayafuji et al. | 372/44 |

OTHER PUBLICATIONS

Nagatomo et al. Vacuum, Electron and Ion Technologies, "GaN single crystal films on silicon substrates grown by MOVPE", pp. 1069–1070, 1991.

*Primary Examiner*—Rodney Bovernick
*Assistant Examiner*—Ellen E. Kang
*Attorney, Agent, or Firm*—Armstrong, Westerman, Hattori, McLeland & Naughton

[57] ABSTRACT

The present invention relates to a semiconductor laser having light emitting wavelengths from blue to UV, more specifically a semiconductor laser which can form a laser resonator by perpendicular cleavage of the substrate and a method for fabricating the semiconductor laser. The semiconductor laser comprises a single crystal substrate 10 of cubic system, and an epitaxial crystal layer 12 with the laser resonator formed by cleavage planes 30 thereof. Cleavage planes 28 of the single crystal substrate 10 and the cleavage planes 30 of the epitaxial crystal layer 12 are not parallel with each other, and the intersection between the cleavage planes 30 of the epitaxial crystal layer 12 and the surface of the single crystal substrate substantially agrees with the intersection L between the cleavage planes 28 of the single crystal substrate 10 and the surface of the single crystal substrate 10.

15 Claims, 10 Drawing Sheets

SEMICONDUCTOR LASER AND METHOD FOR FABRICATING THE SAME

BACKGROUND OF THE INVENTION

The present invention relates to a semiconductor laser, more specifically to a semiconductor laser having an emitted light wavelength range from blue to UV, and a method for fabricating the semiconductor laser.

The conventional semiconductor laser will be explained by means of an InP-based semiconductor laser.

The InP-based semiconductor laser uses an InP single crystal substrate of plane (100) having a zinc-blend structure. On the InP substrate, a first clad layer of InP crystal and an active layer of $In_xGa_{1-x-y}As_yP$ crystal of zinc-blend structure, and a second clad layer of InP crystal, are continuously epitaxially grown, and the laser device is formed.

A laser resonator, which increases photon densities to increase time ratios of the stimulated emission, is constituted by pairs of opposed parallel faces. In the semiconductor laser generally the laser resonator is constituted by opposed parallel cleavage planes. In this case, it is necessary that the cleavage planes are perpendicular to a crystal surface because the semiconductor laser usually uses a structure in which laser beams propagate parallel to the crystal surface.

In the above-described InP-based semiconductor laser, the crystal structure of the epitaxial crystal layer is the same as the zinc-blend structure of the InP substrate. The crystal plane of the grown surface is plane (100) as in the InP substrate. Accordingly, if the epitaxial crystal layer can be cleaved along a cleavage plane which is perpendicular to plane (100), the laser resonator can be fabricated.

In zinc-blend structure, the cleavage plane is plane (110) perpendicular to plane (100). Accordingly, the InP substrate is cleaved at an interval D at the intersection between the plane (100) of the InP substrate surface and the cleavage plane (110) to thereby cleave the epitaxially grown layer along plane (110). Thus, a laser resonator having plane (110) and a length D can be fabricated.

$Al_xGa_{1-x-y}In_yN$ crystal ($0 \leq x \leq 1$, $0 \leq y \leq 1$, $0 \leq 1-x-y \leq 1$) is a direct transition-type semiconductor material which can vary the band gap between 2.1–6.2 eV, and is noted as a blue-to-UV light emitting material. Blue light emitting diodes (LEDs) having a high luminance of above 1 cd are formed of this material.

However, semiconductor lasers of $Al_xGa_{1-x-y}In_y$ crystal have not yet been realized. Reasons for this are as follows.

That is, as described above, a laser resonator is constituted by cleaved planes of an epitaxial crystal layer. To this end, it is preferred that the single crystal substrate and the epitaxial grown layer have the same crystal structure. It is, however, difficult to grow bulk crystals of GaN or AlN, whose crystal structure is the same as the crystal structure of $Al_xGa_{1-x-y}In_yN$, and their single crystal substrates are unavailable. As substrates which allow $Al_xGa_{1-x-y}In_yN$ crystal to grow, sapphire ($Al_2O_3$) substrates have been primarily used.

The sapphire substrate having a corundum structure is different in crystal structure from $Al_xGa_{1-x-y}In_yN$ crystal having wurtzite structure, and has no cleavability with respect to the latter. Accordingly, in fabricating a semiconductor laser using $Al_xGa_{1-x-y}In_yN$ crystal on a sapphire substrate, the conventional vertical cleavage of the substrate cannot be used to fabricate the laser resonator.

SUMMARY OF THE INVENTION

An object of the present invention is to provide a semiconductor laser of $Al_xGa_{1-x-y}In_yN$ crystal whose laser resonator can be fabricated by the use of cleavage of the substrate, and a method for fabricating the semiconductor laser.

The above-described object is achieved by a semiconductor laser comprising a single crystal substrate of cubic system; and an epitaxial crystal layer epitaxially grown on the single crystal layer and constituting a laser resonator by cleavage planes thereof, cleavage planes of the single crystal substrate and the cleavage planes of the epitaxial crystal layer being non-parallel with each other, an intersection between the cleavage planes of the epitaxial crystal layer and a surface of the single crystal substrate substantially agreeing with an intersection between the cleavage planes of the single crystal substrate and the surface of the single crystal substrate. Even in a case that the cleavage plane of the single crystal substrate and the cleavage plane of the epitaxial crystal layer are not parallel with each other, the laser resonator can be formed by cleavage planes of the epitaxial crystal layer.

The above-described object is also achieved by a semiconductor laser comprising a single crystal layer of cubic system a plane orientation of which is substantially plane (111); and an epitaxial crystal layer epitaxially grown on the single crystal substrate and constituting a laser resonator by cleavage planes having a plane orientation of plane (1$\bar{1}$00), a crystal plane of a grown surface being substantially (0001) plane, an intersection between the cleavage planes of the epitaxial crystal layer and a surface of the single crystal substrate substantially agreeing with an intersection between the cleavage plane of plane (100) of the single crystal substrate and the surface of the single crystal substrate. Even in a case that the cleavage plane of the single crystal substrate and the cleavage plane of the epitaxial crystal layer are not parallel with each other, the laser resonator can be formed by the cleavage planes of the epitaxial crystal layer.

In the above-described semiconductor laser, it is preferred that the epitaxial crystal layer is an $Al_xGa_{1-x-y}In_yN$ crystal layer of wurtzite structure, and the single crystal substrate is composed of a compound having spinel structure.

In the above-described semiconductor laser, it is preferred that the compound having spinel structure is $MgAl_2O_4$.

In the above-described semiconductor laser, it is preferred that the epitaxial crystal layer is an $Al_xGa_{1-x-y}In_yN$ crystal layer having wurtzite structure, and the single crystal substrate is composed of a compound of rock-salt structure.

In the above-described semiconductor laser, it is preferred that the compound having rock-salt structure is MgO, MnO, NiO or CoO.

In the above-described semiconductor laser, it is preferred that the epitaxial crystal layer is an $Al_xGa_{1-x-y}In_yN$ crystal layer having wurtzite structure, and the single crystal substrate is a compound having a perovskite structure.

In the above-described semiconductor laser, it is preferred that the compound having perovskite structure is $SrTiO_3$.

The object of the present invention is achieved by a semiconductor laser comprising a silicon substrate a plane orientation of which is substantially plane (111); and an epitaxial crystal layer epitaxially grown on the single crystal substrate and constituting a laser resonator by cleavage planes having a plane orientation of plane (1$\bar{1}$00), a crystal plane of a grown surface being substantially (0001) plane, an intersection between the cleavage planes of the epitaxial crystal layer and a surface of the single crystal substrate substantially agreeing with an intersection between the cleavage plane of plane (1$\bar{1}$11) and the surface of the single crystal substrate. Even in a case that the cleavage plane of the single crystal substrate and the cleavage plane of the epitaxial crystal layer are not parallel with each other, the laser resonator can be formed by the cleavage planes of the epitaxial crystal layer.

The above-described object is achieved by a method for fabricating a semiconductor laser comprising the epitaxial growth step of epitaxially growing an epitaxial crystal layer a crystal plane of a grown surface of which is substantially (0001) on a single crystal substrate of cubic system a plane orientation of which is substantially plane (111); a laser resonator forming step of cleaving the single crystal substrate and the epitaxial crystal layer so that a cleavage plane of the single crystal substrate is plane (100), and a cleavage plane of the epitaxial crystal layer is plane (1$\bar{1}$00) to constitute a laser resonator by opposed cleaved planes of the epitaxial crystal layer. By fabricating a semiconductor laser by this method, even in a case that the cleavage plane of the single crystal substrate and the cleavage plane of the epitaxial crystal layer are not parallel with each other, the laser resonator can be formed by the cleavage planes of the epitaxial crystal layer.

The above-described object can be achieved by a method for fabricating a semiconductor laser comprising the step of epitaxially growing a GaN-based epitaxial layer a crystal plane of a grown surface of which is substantially (0001) plane on an $MgAl_2O_4$ substrate a plane orientation of which is substantially plane (111), the $MgAl_2O_4$ substrate being thermal treated at a temperature above 900° C. before the growth of the GaN-based epitaxial crystal layer so that the plane (111) of the $MgAl_2O_4$ substrate is parallel with plane (0001) of the GaN-based epitaxial crystal layer, and plane (11$\bar{2}$) of the $MgAl_2O_4$ substrate is parallel with plane (1$\bar{1}$00) of the GaN-based epitaxial crystal layer. By fabricating a semiconductor laser by this method, the crystal orientation relationship between the $MgAl_2O_4$ substrate and the GaN-based epitaxial crystal layers grown on the $MgAl_2O_4$ substrate agrees with each other in cleavage orientation, so that cleavage is conducted along the $MgAl_2O_4$ substrate to thereby form the laser resonator of the GaN-based epitaxial crystal layer.

In the above-described method for fabricating a semiconductor laser, the thermal treatment is conducted in a hydrogen atmosphere.

In the above-described method for fabricating a semiconductor laser, it is preferred that the thermal treatment is conducted for 1 minute or more. The $MgAl_2O_4$ substrate and the GaN-based epitaxial crystal layer agree with each other in cleavage orientation.

The above-described object can be achieved by a semiconductor light emitting device comprising an $MgAl_2O_4$ substrate a plane orientation of which is substantially plane (111); and an $Al_xGa_{1-x-y}In_yN$ crystal layer which is epitaxially grown on the $MgAl_2O_4$ substrate, and a plane orientation of a grown surface of which is substantially plane (0001). The semiconductor light emitting device can be formed in the $Al_xGa_{1-x-y}In_yN$ crystal layer grown on the $MgAl_2O_4$ substrate, whereby the semiconductor light emitting device can have emitted light wavelengths from blue to UV.

DETAILED DESCRIPTION OF THE INVENTION

The present invention is based on two findings by the inventors.

A first finding is that $Al_xGa_{1-x-y}In_yN$ crystal of high quality having plane orientation (0001) can be epitaxially grown on plane (111) of a metal oxide single crystal having the crystal structure of cubic system, such as spinel structure, rock-salt structure, perovskite structure, etc.

H. M. Manasevit, et al. tried AlN and GaN crystal growth on spinel ($MgAl_2O_4$) substrates (H. M. Manasevit, F. M. Erdnan and W. I. Simpson, J. Electrochem. Soc., vol. 118 (1971) p. 1864). They did not have the exact result that a single crystal could be grown on a spinel substrate. According to Manasevit, et al., this is because spinel has less thermal stability in comparison with sapphire. However, the inventors of the present invention have found for the first time that GaN crystal of high quality can be grown on a spinel substrate by suitably controlling growth conditions.

A second finding is that even in a case that a cleavage plane of a single crystal substrate is not parallel with a cleavage plane of an epitaxial crystal layer grown on the single crystal substrate, when the intersection between the cleavage plane of the epitaxial crystal layer and the surface of the single crystal substrate substantially agrees with the intersection between the cleavage plane of the single crystal substrate and the surface of the single crystal substrate, the single crystal substrate is cleaved along the intersection, whereby a rupture end face constituted by the cleavage plane of the substrate and the cleavage plane of the epitaxial crystal can be obtained.

These findings will be detailed.

Figure 1A:
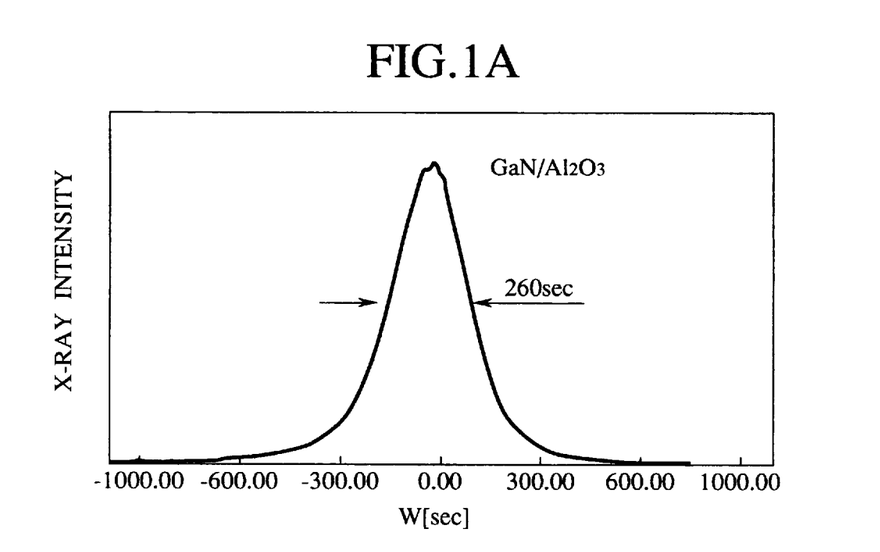
FIGS. 1A and 1B are rocking curves of crystallization of GaN films grown by MOVPE.
Figure 1B:
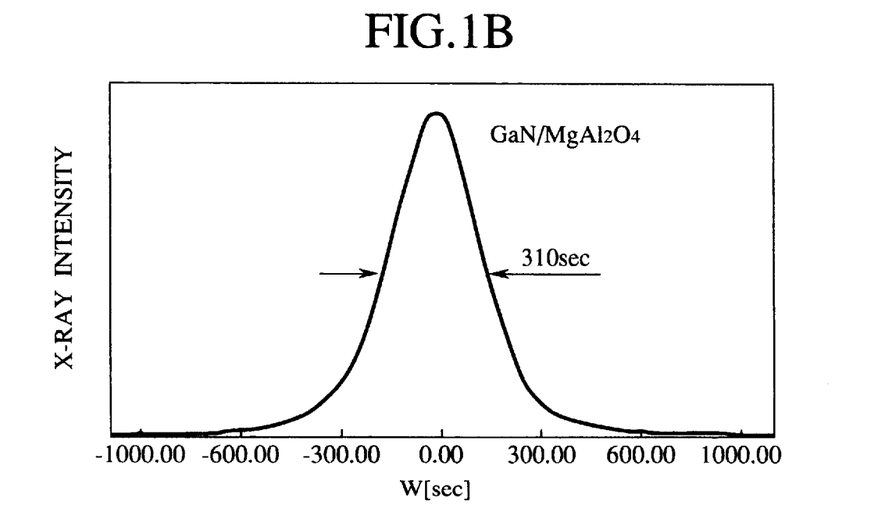

FIGS. 1A and 1B show results of crystallization of GaN films grown on a sapphire substrate and a spinel ($MgAl_2O_4$) substrate by the metal organic vapor phase epitaxial method (MOVPE), which was measured by X-ray rocking curves.

In the X-ray rocking curve, a narrower half width indicates better crystallization. A GaN film of good quality has a half width of about 4–6 minutes. As shown, the X-ray rocking curves have a half-width of 260 seconds for the growth on the sapphire substrate (FIG. 1A) and a half width of 310 seconds for the growth on the spinel substrate (FIG. 1B). It is found that the GaN film grown on the spinel substrate has good crystallization which is not inferior to that of the GaN film grown on the sapphire substrate.

Figure 2A:
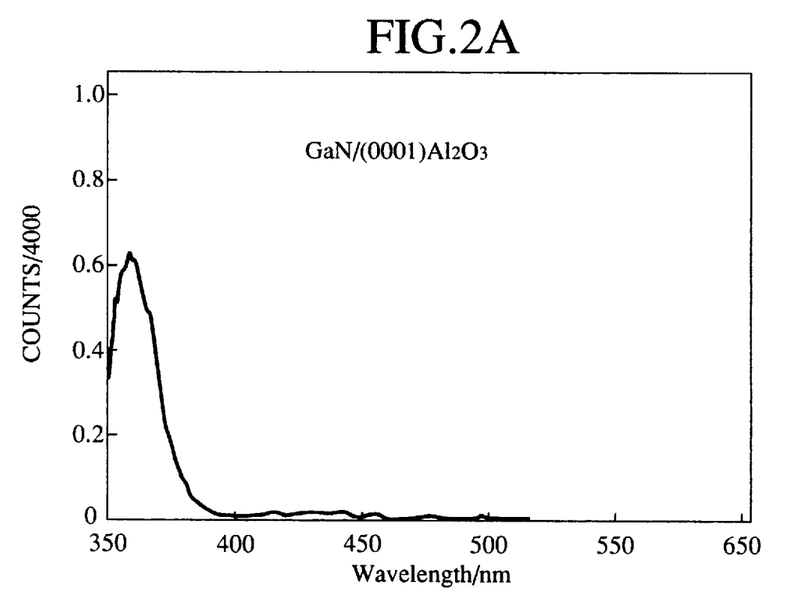
FIG. 2A is a graph of PL spectra of GaN film grown on a sapphire substrate.
Figure 2B:
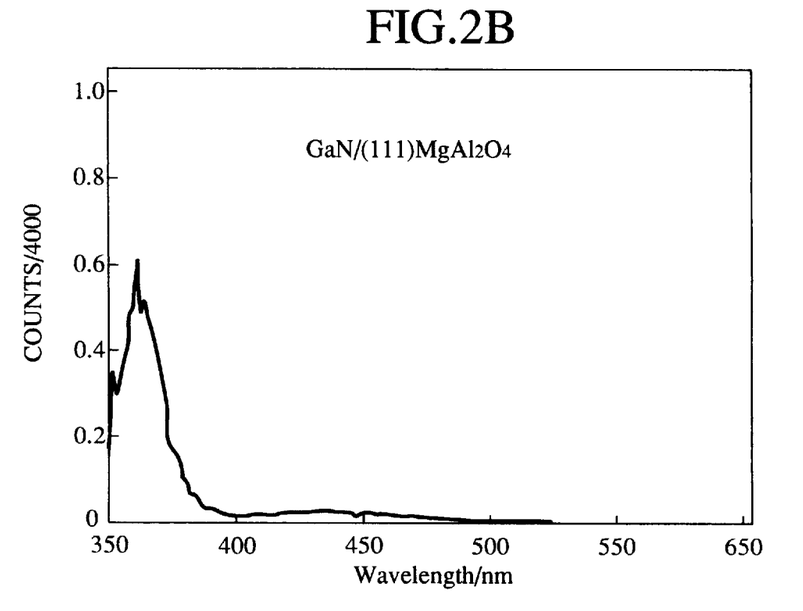
FIG. 2B is a graph of PL spectra of GaN film grown on a spinel substrate.

FIGS. 2A and 2B show photo-luminescence (PL) spectra of a GaN film grown on a sapphire substrate and a GaN film grown on a spinel substrate. FIG. 2A shows the spectrum of the GaN film grown on the sapphire substrate, and FIG. 2B shows the spectrum of the GaN film grown on the spinel substrate.

A shown, both spectra have dominant luminescences at 360 nm. It is found that qualities of both are equal.

Thus, the GaN film grown on a spinel substrate can have substantially the same film quality as that grown on a sapphire substrate. Accordingly, it is considered that $Al_xGa_{1-x-y}In_yN$ crystal having the same crystal structure as GaN film can be grown on plane (111) of a metal oxide single crystal having cubic system, such as spinel structure, rock-salt structure, perovskite structure, etc.

Figure 3:
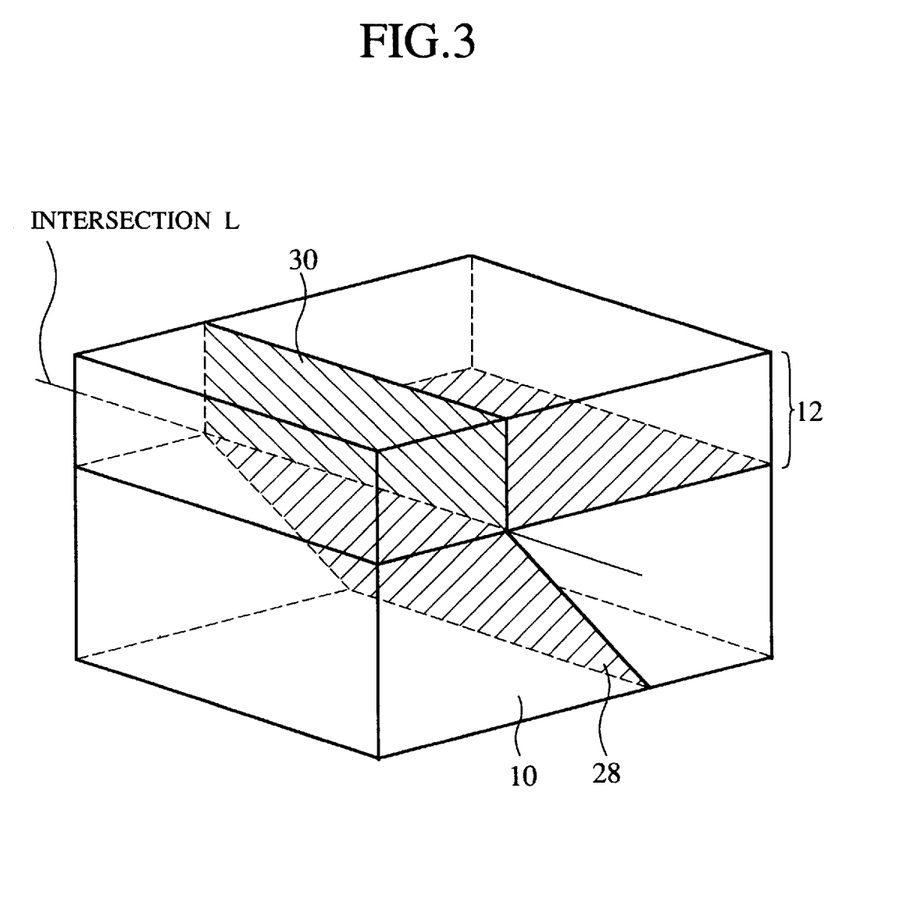
FIG. 3 is an explanatory view of the principle of cleaving the substrate in embodiments of the present invention.

FIG. 3 is an explanatory view of the principle for cleaving a substrate according to the present invention.

It is conventional knowledge that when an epitaxial crystal layer is grown on a single crystal substrate, to obtain the cleavage plane of the epitaxial layer, which is perpendicular to the surface of the single crystal substrate, the cleavage plane of the single crystal substrate must be parallel with the cleavage plane of the epitaxial crystal layer.

However, it has been found that unless a cleavage plane 28 of a single crystal substrate 10 is not parallel with a cleavage plane 30 of an epitaxially grown crystal layer 12 grown on the single crystal layer 10, in a case that the intersection between the cleavage plane 30 of the epitaxial crystal layer 12 and the surface of the single crystal layer 10 substantially agrees with the intersection L between the cleavage plane 28 of the single crystal substrate 10 and the surface of the single crystal substrate 10, a rupture end face constituted by the cleavage plane 28 of the single crystal substrate 10 and the cleavage plane 30 of the epitaxial crystal layer 12 can be obtained by cleaving the single crystal substrate 10 along the intersection L.

Figure 4:
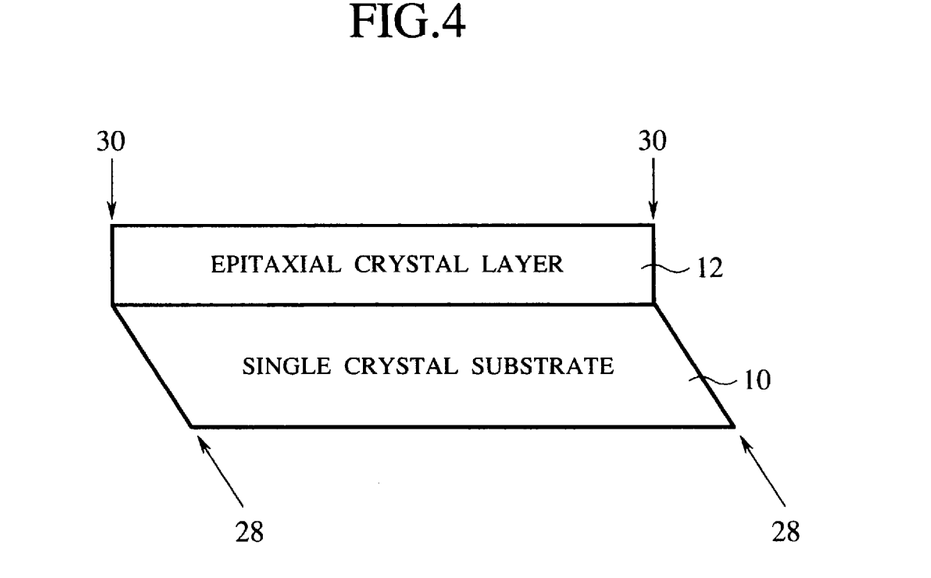
FIG. 4 is a schematic sectional view of a laser resonator formed by cleaved planes.

This property obtained in cleaving the substrate is useful to fabricating a semiconductor laser. That is, since the single crystal substrate 10 and the epitaxial crystal layer 12 have crystal structures different from each other, and their cleavage planes are not parallel with each other, as exemplified in FIG. 4, if the cleavage plane 30 of the epitaxial crystal layer 12 is perpendicular to the surface of the single crystal substrate 10, the laser resonator can be constituted by the cleavage plane 30 of the epitaxial crystal layer 12.

For example, when a GaN film is grown on a spinel substrate, the cleavage plane of the GaN film, plane (1$\bar{1}$00) is perpendicular to the spinel substrate, and the laser resonator can be constituted.

Thus, by combining the above-described facts, $Al_xGa_{1-x-y}In_yN$ crystal of high quality can be epitaxially grown on plane (111) of a metal oxide single crystal having cubic system, and also a cleavage plane perpendicular to the substrate surface can be formed, so that a semiconductor laser of $Al_xGa_{1-x-y}In_yN$ crystal can be fabricated.

Next, the semiconductor laser according to a first embodiment of the present invention, and the method for fabricating the same will be explained with reference to FIGS. 5, 6A–6B, and 7A–7B.

Figure 5A:
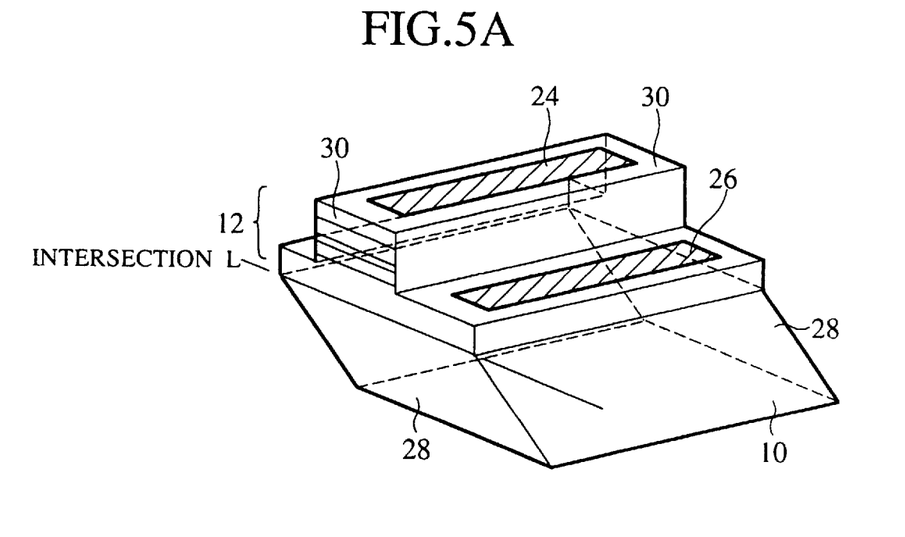
FIGS. 5A and 5B are schematic views of the semiconductor laser according to a first embodiment of the present invention, which show the structure thereof.
Figure 5B:
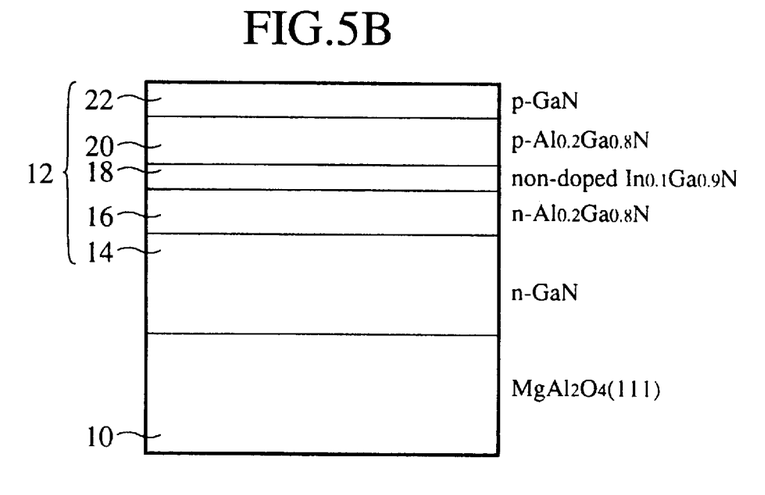

FIG. 5 is a schematic view of the semiconductor laser according to the present embodiment. FIGS. 6A–6B and 7A–7B are views of the semiconductor laser according to the present embodiment at the steps of the method for fabricating the semiconductor laser.

First, the structure of the semiconductor laser according to the present embodiment will be explained with reference to FIG. 5. FIG. 5A is a schematic view of the semiconductor laser according to the present embodiment. FIG. 5B is a sectional view of the semiconductor laser according to the present embodiment.

An epitaxial crystal layer 12 whose surface has plane orientation (0001) is grown on a spinel single crystal substrate 10 whose surface is plane (111). The epitaxial crystal layer 12 comprises a 4 $\mu$m-thick buffer layer of n-GaN 14, a 1 $\mu$m-thick clad layer 16 of n-$Al_{0.2}Ga_{0.8}N$, a 0.05 $\mu$m-thick active layer 18 of non-doped $In_{0.1}Ga_{0.9}N$, a 1 $\mu$m-thick clad layer 20 of p-$Al_{0.2}Ga_{0.8}N$, and a 0.5 $\mu$m-thick contact layer 22 of p-GaN deposited one on another (FIG. 5B).

The epitaxial crystal layer 12 is patterned in a mesa structure. A p-type electrode 24 of gold (Au) is formed on the contact layer 20. An n-type electrode 26 of aluminum (Al) is formed on the buffer layer 14.

Cleavage planes 28 of the single crystal substrate 10 are plane (100) and adjoin the surface of the single crystal substrate 10 at the intersection L.

Cleaved planes 30 of the epitaxial crystal layer constituting a laser resonator are plane (1$\bar{1}$00), and are perpendicular to the surface of the single crystal substrate 10 and adjoin the surface of the single crystal substrate 10 at the intersection L (FIG. 5A).

Then, the method for fabricating the semiconductor laser according to the present embodiment will be explained with reference to FIGS. 6A–6B and 7A–7B.

Figure 6A:
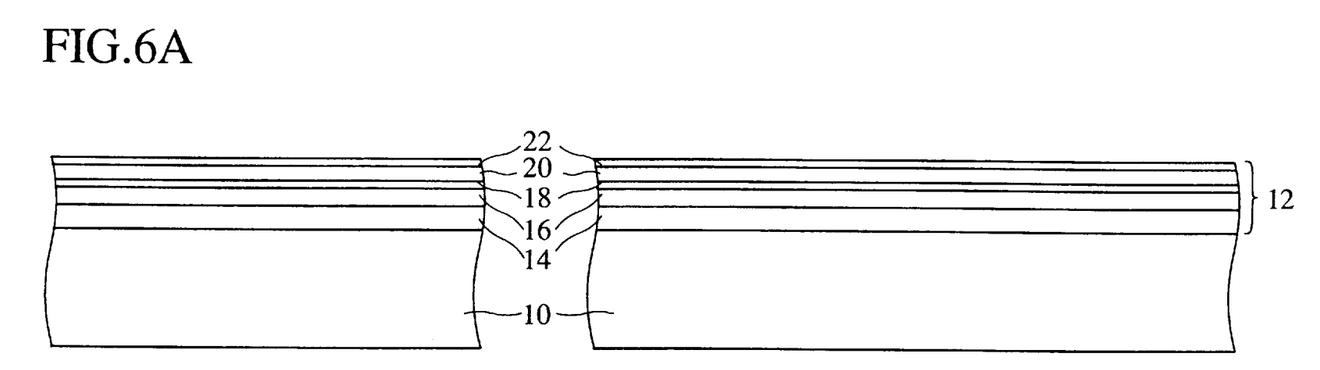
FIGS. 6A–6B and 7A–7B are sectional views of the semiconductor laser according to the first embodiment at the steps of the method for fabricating the semiconductor laser, which show the method.
Figure 6B:
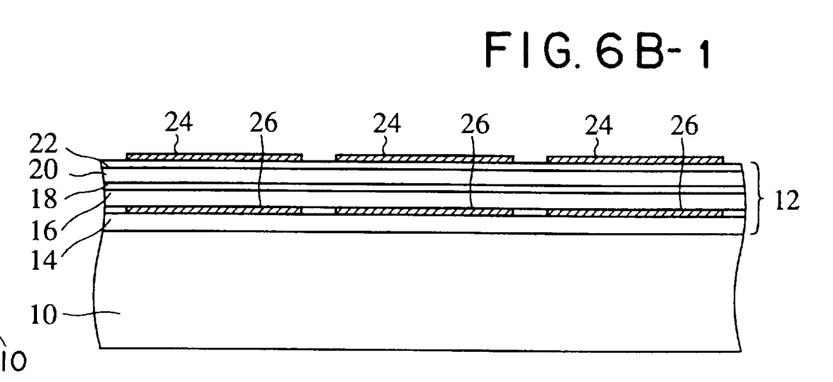

On the spinel single crystal substrate 10 whose surface is plane (111) the 4 $\mu$m-thick buffer layer 14 of n-GaN, the 1 $\mu$m-thick clad layer 16 of n-$Al_{0.2}Ga_{0.8}N$, the 0.05 $\mu$m-thick active layer 18 of non-doped $In_{0.1}Ga_{0.9}N$, the 1 $\mu$m-thick clad layer 20 of p-$Al_{0.2}Ga_{0.8}N$, the 0.5 $\mu$m-thick contact layer 22 of p-GaN deposited one on another are continuously epitaxially grown, and the epitaxial crystal layer 12 whose surface is plane orientation (0001) is formed. A laser device is formed on the epitaxial crystal layer 12 (FIG. 6A).

Then, the epitaxial crystal layer 12 is patterned down to the clad layer 16 by the usual lithography and dry etching into the mesa structure.

Figure 6B:
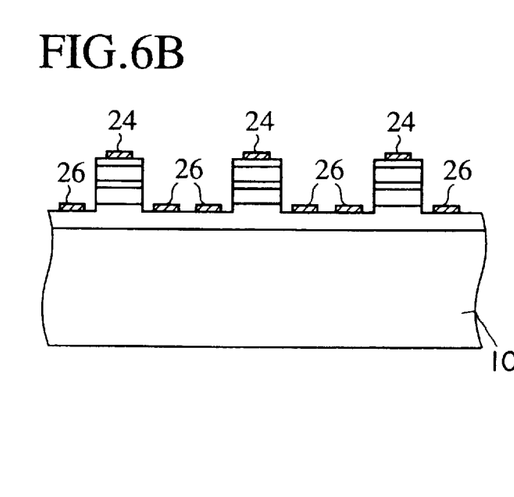

Subsequently Au, for example, is vapor-deposited on the contact layer 22 to form the p-type electrode 24. Similarly Al, for example, is vapor-deposited on the buffer layer 14 which has been exposed by the mesa etching to form the n-type electrode (FIG. 6B).

Figure 7A:
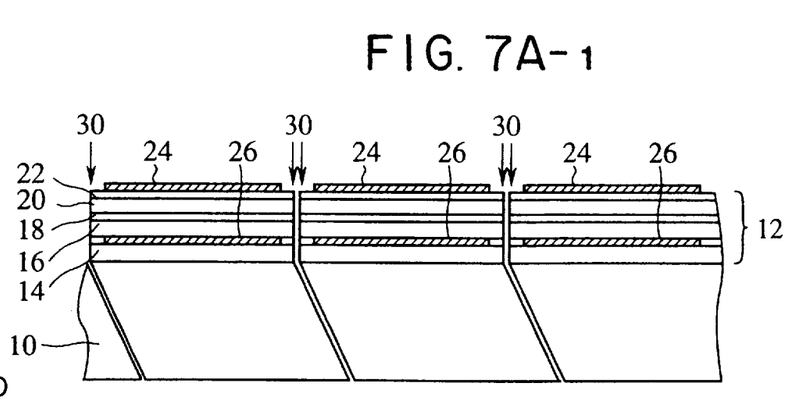
Figure 7A:
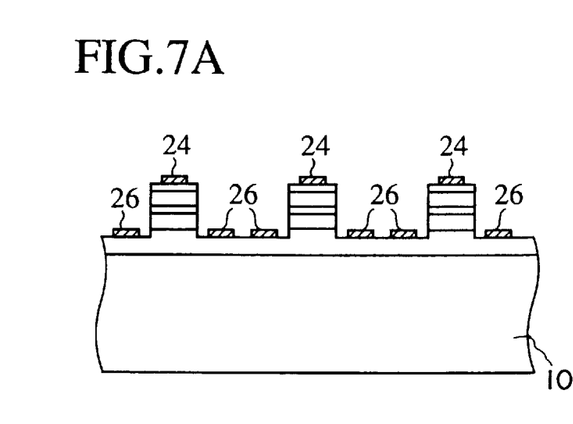
Figure 7B:
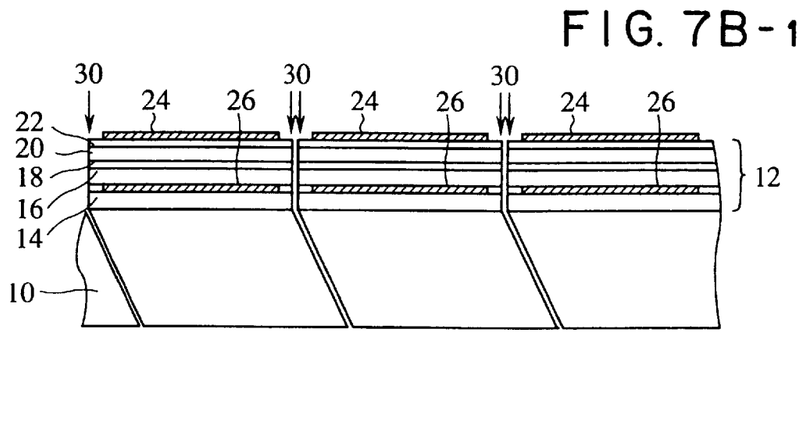

Then, the single crystal substrate 10 is cleaved at, e.g., a 900 $\mu$m interval along plane (100) of the single crystal substrate 10. By thus cleaving the single crystal substrate 10, the epitaxial crystal layer 12 is cleaved along the plane (1$\bar{1}$00).

The formed cleaved planes 30 are perpendicular to the surface of the single crystal substrate 10, and a 900 $\mu$m-length laser resonator is constituted by the cleavage planes 30 of plane (1$\bar{1}$00) (FIG. 7A).

Figure 7B:
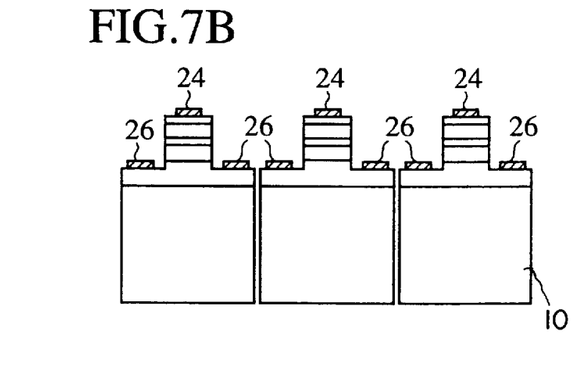

Then, the cleaved single crystal substrate 10 is diced together with the device into semiconductor lasers having 900 $\mu$m-length laser resonators (FIG. 7B).

Thus, according to the present embodiment, the laser device of $Al_xGa_{1-x-y}In_yN$-based crystal is grown on a spinel substrate, and in cleaving the spinel substrate, the epitaxial crystal layer is cleaved perpendicularly to the surface of the spinel substrate, whereby the laser resonator can be constituted by the cleavage planes. The semiconductor laser of $Al_xGa_{1-x-y}In_yN$ crystal can be realized.

In the above-described embodiment, the single crystal substrate for $Al_xGa_{1-x-y}In_yN$ crystal to be grown on is a spinel substrate but is not limited to a spinel substrate as long as $Al_xGa_{1-x-y}In_yN$ crystal can be epitaxially grown thereon, and in cleaving the single crystal substrate, the epitaxially crystal layer can be cleaved perpendicularly to the surface of the single crystal substrate.

$Al_xGa_{1-x-y}In_yN$ crystal can be grown on plane (111) of metal oxide single crystals of crystal structures of cubic system, such as spinel structure, rock-salt structure, perovskite structure, etc.

Single crystal substrates of MgO, MnO, NiO, CoO, etc. having rock-salt structure, and single crystal substrates of $SrTiO_3$, etc., having perovskite structure are preferred.

The single crystal substrate having perovskite structure may be basic perovskite structure of cubic system or modified perovskite structure.

As long as the surface of a single crystal substrate has the property of (111) plane, its plane orientation may be offset within a range in which the property is not changed. For example, an about $\pm 10°$ offset can maintain the property of plane (111), and the semiconductor laser can be fabricated using the single crystal substrate.

In a case that a (111) silicon substrate is used as the single crystal substrate, silicon substrate is he silicon substrate is cleaved along plane $(\bar{1}11)$ so that the intersection between the cleavage plane of the epitaxial crystal layer and the surface of the single crystal substrate agrees with the intersection between the cleavage plane of the single crystal substrate and the surface of the single crystal substrate.

In the above-described embodiment the semiconductor laser is fabricated by the use of the cleavage of an epitaxial crystal layer, but by the use of the optical properties of the $Al_xGa_{1-x-y}In_yN$ crystal layer, other semiconductor light emitting devices may be fabricated. For example, a blue light emitting diode using the $Al_xGa_{1-x-y}In_yN$ crystal layer on a (111) $MgAl_2O_4$ substrate can be fabricated.

Then, the method for fabricating the semiconductor laser according to a second embodiment of the present invention will be explained with reference to FIGS. 8A–8D, 9 and 10.

Figure 9:
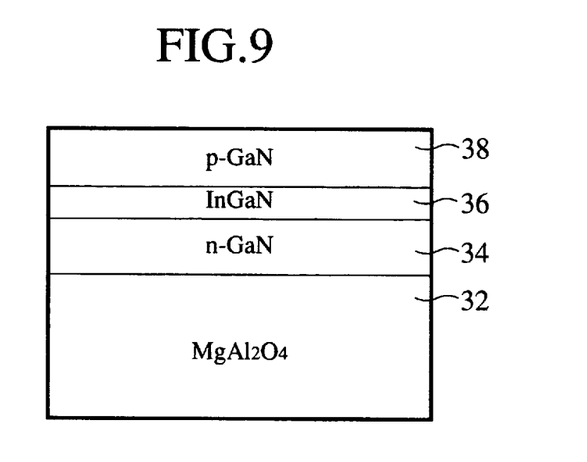
FIG. 9 is a schematic sectional view of the semiconductor laser according to a second embodiment of the present invention.
Figure 10:
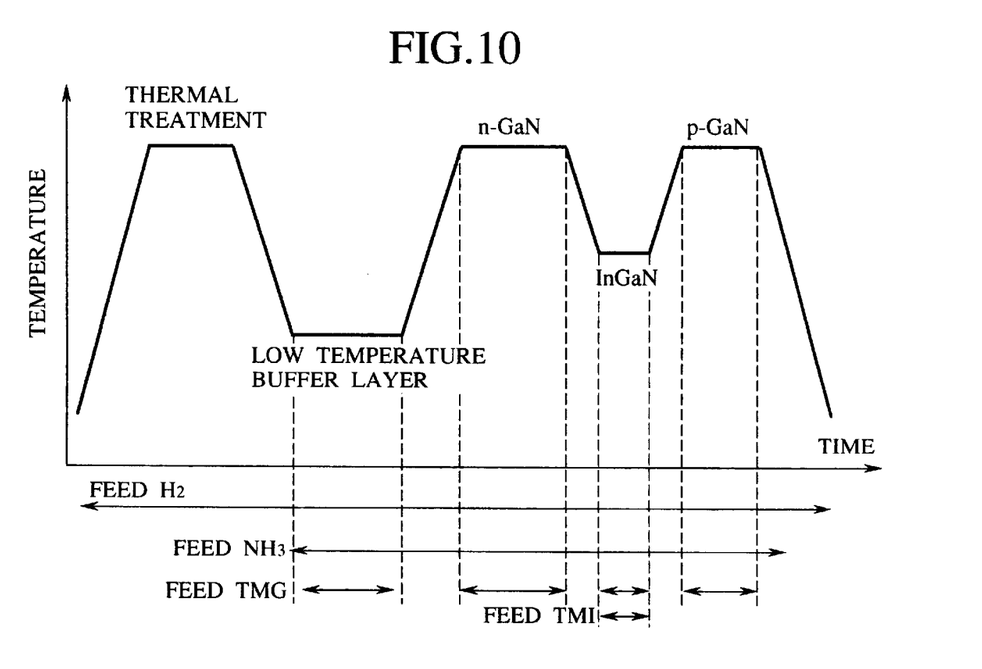
FIG. 10 is an explanatory view of the method for fabricating a semiconductor laser according to the second embodiment of the present invention.

FIGS. 8A–8D are views which explain relationships of plane orientation between a spinel substrate and a GaN crystal layer. FIG. 9 is a schematic sectional view of the semiconductor laser according to the present embodiment, which shows the structure thereof. FIG. 10 is a view showing the method for fabricating the semiconductor laser according to the present embodiment.

In the first embodiment, the method for fabricating the semiconductor laser in which an $Al_xGa_{1-x-y}In_yN$ crystal layer is epitaxially grown on a spinel (111) substrate to fabricate the semiconductor laser has been described. However, in a case that spinel is used as a base substrate, there is a problem that when a GaN-based crystal layer is grown on the spinel substrate, the plane orientation relationship between the substrate and the epitaxial crystal layer is unstable. This problem will be explained below by the use of an example that a GaN crystal layer having plane orientation (0001) is epitaxially grown on a spinel (111) substrate.

Figure 8A:
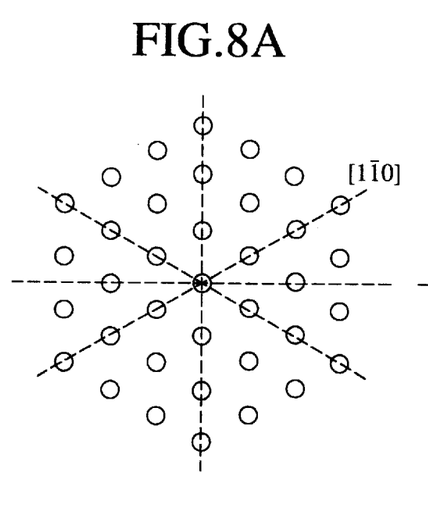
FIGS. 8A–8D are explanatory views of crystal orientation relationships between a spinel substrate and a GaN crystal layer.

The surface of the spinel (111) substrate has the oxygen atom arrangement shown in FIG. 8A. The cleavage plane of the spinel is plane (001), and the cleavage orientation in plane (111) is orientation $[1\bar{1}0]$ indicated by the dotted lines in FIG. 8A.

Figure 8B:
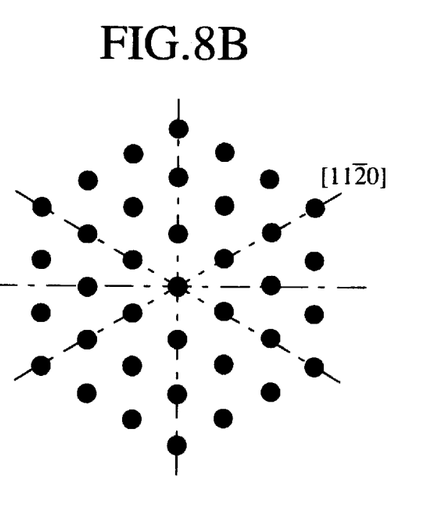

On the other hand, the surface of the GaN (0001) surface has the nitrogen atom arrangement shown in FIG. 8B. The cleavage plane of the GaN is plane $(10\bar{1}0)$, and the cleavage orientation in plane (0001) is $[11\bar{2}0]$ indicated by the one-dot chain lines.

In a case that the laser resonator is constituted by the cleavage, it is necessary that the cleavage orientation of the spinel substrate agrees with the cleavage orientation of the GaN crystal layer. That is, plane $(11\bar{2})$ of the spinel substrate and plane $(1\bar{1}00)$ of the GaN crystal layer must be parallel with each other.

Figure 8C:
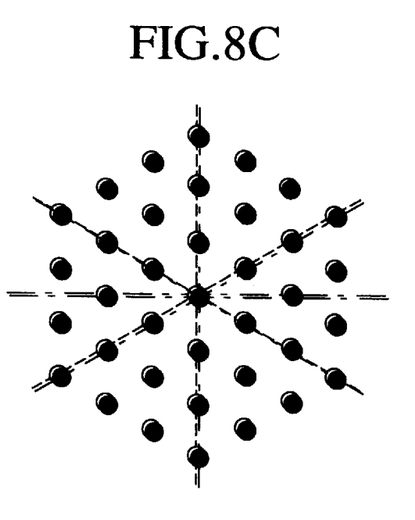
Figure 8D:
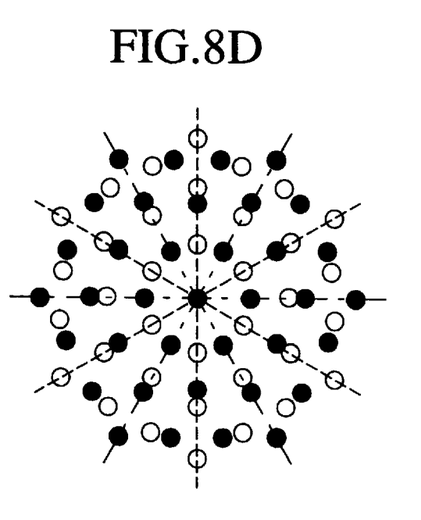

In growing the GaN crystal layer by the conventional epitaxial growth technique, agreement of the cleavage orientation of the spinel substrate with that of the GaN crystal layer (hereinafter called crystal orientation relationship α) as shown in FIG. 8C, and disagreement of the cleavage orientation of the spinel substrate with that of the GaN crystal layer (hereinafter called crystal orientation relationship β) as shown in FIG. 8D adversely occur at random. To overcome this problem, the inventors have studied and found it important to make a thermal treatment on the spinel substrate before the growth of the GaN crystal layer, and have found that the temperature of the thermal treatment must be controlled to thereby perfectly control the crystal orientation relationship.

Table 1 shows crystal orientation relationships between spinal substrates which have been thermal treated at different temperatures in a hydrogen atmosphere before the growth of GaN crystal layers, and the GaN crystal layers.

TABLE 1

| Thermal Treatment Temperature | Crystal Orientation Relationship |
| --- | --- |
| below 500° C. | α and β occurred random |
| 600° C. | only β occurred |
| 800° C. | only β occurred |
| 900° C. | β stably occurred (α about 1%) |
| 1000° C. | only α occurred |
| 1100° C. | only α occurred |

As shown in Table 1, at substrate treatment temperatures below 500° C., the crystal orientation relationship α and the crystal orientation relationship β occur at random. At substrate treatment temperatures between 500°–900° C., the crystal orientation relationship β stably occurs. At substrate treatment temperatures above 900° C. the crystal orientation relationship α stably occurs.

Based on this result, to stably obtain the crystal orientation relationship α, in which the cleavage orientations agree with each other, the substrate thermal treatment should be conducted at a temperature above 900° C.

Next, the semiconductor laser according to the present embodiment, and the method for fabricating the same will be explained with reference to FIGS. 9 and 10.

In the present embodiment, a purple light emitting semiconductor laser having a p-GaN/InGaN/n-GaN structure on a spinel substrate will be explained.

As shown in FIG. 9, a first clad layer of an n-GaN crystal layer 34 is formed on a spinel substrate 32, an active layer of an InGaN layer 36 is formed on the n-GaN crystal layer 34, and a second clad layer of p-GaN layer 38 is formed on the InGaN crystal layer 36.

First, the spinel substrate 10 is thermal treated in a hydrogen atmosphere for 10 minutes at 1030° C. This thermal treatment makes the crystal orientation relationship of the spinel substrate 10 with a GaN crystal layer which will be grown later, into crystal orientation relationship α.

To obtain the crystal orientation α, as described above, a thermal treatment at above 900° C. is required. It is considered that the effect is produced by the thermal treatment of more than 1 minute although the treatment time is dependent on thermal treatment temperatures. The thermal treatment atmosphere is not limited to the hydrogen atmosphere, and can be conducted in reducing atmospheres and inactive atmospheres, such as vacuum, nitrogen, argon, etc.

Then, the substrate temperature is lowered to 550° C. which is the growth temperature of the low-temperature buffer layer, and $NH_3$ (ammonium) which is a Group V element source gas is fed.

Subsequently TMG (trimethylgallium) which is a Group III element source gas is fed for a prescribed period of time to form the low-temperature buffer layer of GaN by MOVPE. For example, TMG is fed for 36 seconds, and the GaN layer is formed in an about 30 nm-thickness.

Subsequently with the feed of the $NH_3$ set on, the substrate temperature is again raised to 1030° C. which is the growth temperature of the n-GaN crystal layer 34.

Then, TMG which is a Group III element source gas is fed for a prescribed period of time to deposit the n-GaN crystal layer 34 by MOVPE. Thus, the clad layer of the n-GaN crystal layer 34 is formed in an about 4 $\mu$m-thickness. Monosilane ($SiH_4$) is used for the doping for the n-type.

Subsequently, with the $NH_3$ being fed, the substrate temperature is lowered to 800° C. which is the growth temperature of the InGaN crystal layer 36, and TMI (trimethyl indium) and TMG are fed for a prescribed period of time. Thus, the InGaN crystal layer 36 is deposited in an about 20 nm-thickness by MOVPE and the active layer is formed.

Then, with the feed of the $NH_3$ gas set on, the substrate temperature is again raised to 1030° C. which is the growth temperature of the p-GaN crystal layer 38.

Next, TMG which is a Group III element source gas is fed for a prescribed period of time, and the p-GaN crystal layer 38 is deposited by MOVPE. Thus, the clad layer of the p-GaN crystal layer 38 is formed in an about 2 $\mu$m-thickness. $Cp_2Mg$, for example, is used for the p-type doping.

The p-GaN/InGaN/n-GaN structure is thus formed on the spinel substrate 10, and then the semiconductor laser is fabricated in the method for fabricating the semiconductor laser according to the first embodiment as shown in FIGS. 6B to 7B.

The semiconductor laser is thus fabricated, whereby the crystal orientation relationship between the spinel substrate and the n-GaN crystal layer 38 can be the crystal orientation relationship $\alpha$, and the laser resonator can be formed by cleavage.

As described above, according to the present embodiment, in growing the GaN-based crystal layers on the spinel substrate (111), thermal treatments are conducted at prescribed temperatures before the growth of the GaN-based crystal layers, whereby a crystal orientation relationship of the spinel substrate and that of the GaN crystal layer can agree with each other.

As a result, the GaN-based crystal layers can be cleaved concurrently with cleavage of the spinel substrate to form the laser resonator, whereby the semiconductor laser can be formed of GaN-based crystals.

In the present embodiment, the semiconductor laser of the p-GaN/InGaN/n-GaN structure formed on a spinel substrate is fabricated, but the semiconductor laser can be formed of other GaN-based crystals. For example, the semiconductor laser can be formed of $Al_xGa_{1-x-y}In_yN$ crystal layer as described in the first embodiment.

The film depositing conditions, etc., of the present embodiment are merely an example and preferably are optimized in accordance with structures of the semiconductor laser, fabrication systems, etc.

What is claimed is:

1. A semiconductor laser comprising:
   a single crystal substrate of cubic system; and an epitaxial crystal layer having a different crystal structure from the single crystal substrate, epitaxially grown on the single crystal substrate and constituting a laser resonator by cleavage planes thereof, cleavage planes of the single crystal substrate and the cleavage planes of the epitaxial crystal layer being non-parallel with each other;

an intersection between the cleavage planes of the epitaxial crystal layer and a surface of the single crystal substrate substantially agreeing with an intersection between the cleavage planes of the single crystal substrate and the surface of the single crystal substrate.

2. A semiconductor laser comprising:
   a single crystal layer of cubic system a plane orientation of which is substantially plane (111); and an epitaxial crystal layer epitaxially grown on the single crystal substrate and constituting a laser resonator by cleavage planes having a plane orientation of plane (1 $\overline{1}$00), a crystal plane of a grown surface being substantially (0001) plane, an intersection between the cleavage planes of the epitaxial crystal layer and a surface of the single crystal substrate substantially agreeing with an intersection between the cleavage plane of plane (100) of the single crystal substrate and the surface of the single crystal substrate.

3. A semiconductor laser according to claim 2, wherein the epitaxial crystal layer is an $Al_xGa_{1-x-y}In_yN$ crystal layer of wurtzite structure, and
   the single crystal substrate is composed of a compound having spinel structure.

4. A semiconductor laser according to claim 3, wherein the compound having spinel structure is $MgAl_2O_4$.

5. A semiconductor laser according to claim 2, wherein the epitaxial crystal layer is an $Al_xGa_{1-x-y}In_yN$ crystal layer having wurtzite structure, and
   the single crystal substrate is composed of a compound of rock-salt structure.

6. A semiconductor laser according to claim 5, wherein the compound having rock-salt structure is MgO, MnO, NiO or CoO.

7. A semiconductor laser according to claim 2, wherein the epitaxial crystal layer is an $Al_xGa_{1-x-y}In_yN$ crystal layer having wurtzite structure, and
   the single crystal substrate is a compound having a perovskite structure.

8. A semiconductor laser according to claim 7, wherein the compound having perovskite structure is $SrTiO_3$.

9. A semiconductor laser comprising:
   a silicon substrate a plane orientation of which is substantially plane (111); and an epitaxial crystal layer epitaxially grown on the single crystal substrate and constituting a laser resonator by cleavage planes having a plane orientation of plane (1 $\overline{1}$00), a crystal plane of a grown surface being substantially (0001) plane, an intersection between the cleavage planes of the epitaxial crystal layer and a surface of the single crystal substrate substantially agreeing with an intersection between the cleavage plane of plane ($1\bar{1}11$) and the surface of the single crystal substrate.

10. A method for fabricating a semiconductor laser comprising:

an epitaxial growth step of epitaxially growing an epitaxial crystal layer a crystal plane of a grown surface of which is substantially (0001) on a single crystal substrate of cubic system a plane orientation of which is substantially plane (111);

a laser resonator forming step of cleaving the single crystal substrate and the epitaxial crystal layer so that a cleavage plane of the single crystal substrate is plane (100), and cleavage planes of the epitaxial crystal layer is plane ($1\bar{1}00$) to constitute a laser resonator by opposed cleaved planes of the epitaxial crystal layer.

11. A method for fabricating a semiconductor laser comprising a step of epitaxially growing a GaN-based epitaxial layer a crystal plane of a grown surface of which is substantially (0001) plane on an $MgAl_2O_4$ substrate a plane orientation of which is substantially plane (111), the $MgAl_2O_4$ substrate being thermal treated at a temperature above 900° C. before the growth of the GaN-based epitaxial crystal layer so that the plane (111) of the $MgAl_2O_4$ substrate is parallel with plane (0001) of the GaN-based epitaxial crystal layer, and plane (11$\bar{2}$) of the $MgAl_2O_4$ substrate is parallel with plane (1$\bar{1}$00) of the GaN-based epitaxial crystal layer.

12. A method for fabricating a semiconductor laser according to claim 11, wherein the thermal treatment is conducted in a hydrogen atmosphere.

13. A method for fabricating a semiconductor laser according to claim 12, wherein the thermal treatment is conducted for 1 minute or more.

14. A method for fabricating a semiconductor laser according to claim 11, wherein the thermal treatment is conducted for 1 minute or more.

15. A semiconductor light emitting device comprising:

an $MgAl_2O_4$ substrate a plane orientation of which is substantially plane (111); and an $Al_xGa_{1-x-y}In_yN$ crystal layer which is epitaxially grown on the $MgAl_2O_4$ substrate, and a plane orientation of a grown surface of which is substantially plane (0001).

* * * * *